United States Patent
Tanaka et al.

(10) Patent No.: US 6,210,539 B1
(45) Date of Patent: *Apr. 3, 2001

(54) METHOD AND APPARATUS FOR PRODUCING A UNIFORM DENSITY PLASMA ABOVE A SUBSTRATE

(75) Inventors: Yoichiro Tanaka, Santa Clara; Liubo Hong, San Jose, both of CA (US); Yuichi Wada, Chiba (JP)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/856,335

(22) Filed: May 14, 1997

(51) Int. Cl.$^7$ .................................................. C23C 14/34
(52) U.S. Cl. ............................ 204/192.12; 204/298.06; 204/298.08; 204/298.09; 204/298.15; 118/723 I
(58) Field of Search ................. 204/192.12, 298.16, 204/298.22, 298.06, 298.08, 298.09, 298.15; 118/723 I; 156/345; 216/68

(56) References Cited

U.S. PATENT DOCUMENTS

| 3,730,867 | 5/1973 | Albers et al. . |
| 4,336,118 | 6/1982 | Patten et al. . |

(List continued on next page.)

FOREIGN PATENT DOCUMENTS

| 0520519 | 12/1992 | (EP) . |
| 0601595 | 12/1993 | (EP) . |
| 0607797 | 1/1994 | (EP) . |
| 0653776 | 10/1994 | (EP) . |
| 0727807 | 1/1996 | (EP) . |
| 0727923 | 2/1996 | (EP) . |
| 0758148 | 8/1996 | (EP) . |
| 2162365 | 1/1986 | (GB) . |
| 2231197 | 11/1990 | (GB) . |
| 59-190363 | 10/1984 | (JP) . |
| 61-190070 | 8/1986 | (JP) . |
| 63-246814 | 10/1988 | (JP) . |
| 6232055 | 8/1994 | (JP) . |
| 6283470 | 10/1994 | (JP) . |
| 7176398 | 7/1995 | (JP) . |
| 7176399 | 7/1995 | (JP) . |
| 888190 | 4/1996 | (JP) . |
| 8153712 | 6/1996 | (JP) . |
| 8288259 | 11/1996 | (JP) . |
| WO860623 | 11/1986 | (WO) . |
| 9515372 | 6/1995 | (WO) . |

OTHER PUBLICATIONS

Hayden, D.B., et al., "Characterization of magnetron–sputtered partially ionized aluminum deposition," J. Vac. Sci. Technol. A 16(2), 624–627.

(List continued on next page.)

Primary Examiner—Stephen Kalafut
Assistant Examiner—Julian A. Mercado
(74) Attorney, Agent, or Firm—Konrad, Raynes & Victor, LLP

(57) ABSTRACT

An apparatus and method for processing a substrate in the presence of a plasma, the apparatus including: a chamber enclosing a region maintained at a low pressure; a substrate support disposed in the region and having a substantially horizontal substrate support surface for supporting a substrate; and a coil disposed in the chamber and for producing a radio frequency field within the chamber to create an ionizing plasma above the substrate support surface, the coil being disposed for maintaining a plasma having equipotential lines which extend substantially parallel to the upper surface of the substrate across substantially the entire upper surface of the substrate.

43 Claims, 3 Drawing Sheets

U.S. PATENT DOCUMENTS

| | | |
|---|---|---|
| 4,361,472 | 11/1982 | Morrison, Jr. . |
| 4,362,632 | 12/1982 | Jacob . |
| 4,422,896 * | 12/1983 | Class et al. ............................ 156/643 |
| 4,626,312 | 12/1986 | Tracy . |
| 4,661,228 | 4/1987 | Mintz . |
| 4,716,491 | 12/1987 | Ohno et al. . |
| 4,792,732 | 12/1988 | O'Loughlin . |
| 4,842,703 | 6/1989 | Class et al. . |
| 4,844,775 | 7/1989 | Keeble . |
| 4,865,712 | 9/1989 | Mintz . |
| 4,871,421 | 10/1989 | Ogle et al. . |
| 4,918,031 | 4/1990 | Flamm et al. . |
| 4,925,542 | 5/1990 | Kidd . |
| 4,941,915 | 7/1990 | Matsuoka et al. . |
| 4,948,458 | 8/1990 | Ogle . |
| 4,990,229 | 2/1991 | Campbell et al. . |
| 4,999,096 | 3/1991 | Nihei et al. . |
| 5,065,698 | 11/1991 | Koike . |
| 5,091,049 | 2/1992 | Campbell et al. . |
| 5,102,496 * | 4/1992 | Savas ................................... 156/643 |
| 5,122,251 | 6/1992 | Campbell et al. . |
| 5,135,629 | 8/1992 | Sawada et al. . |
| 5,135,634 * | 8/1992 | Clarke ............................ 204/298.06 |
| 5,146,137 | 9/1992 | Gesche et al. . |
| 5,175,608 | 12/1992 | Nihei et al. . |
| 5,178,739 | 1/1993 | Barnes et al. . |
| 5,198,725 * | 3/1993 | Chen et al. ...................... 315/111.41 |
| 5,206,516 | 4/1993 | Keller et al. . |
| 5,225,740 | 7/1993 | Ohkawa . |
| 5,231,334 | 7/1993 | Paranjpe . |
| 5,234,560 | 8/1993 | Kadlec et al. . |
| 5,241,245 | 8/1993 | Barnes et al. . |
| 5,280,154 | 1/1994 | Cuomo et al. . |
| 5,304,279 | 4/1994 | Coultas et al. . |
| 5,312,717 | 5/1994 | Sachdev et al. . |
| 5,346,578 | 9/1994 | Benzing et al. . |
| 5,361,016 | 11/1994 | Ohkawa et al. . |
| 5,366,590 | 11/1994 | Kadomura . |
| 5,368,685 | 11/1994 | Kumihashi et al. . |
| 5,397,962 | 3/1995 | Moslehi . |
| 5,401,350 | 3/1995 | Patrick et al. . |
| 5,404,079 | 4/1995 | Ohkuni et al. . |
| 5,418,431 | 5/1995 | Williamson et al. . |
| 5,421,891 | 6/1995 | Campbell et al. . |
| 5,429,070 | 7/1995 | Campbell et al. . |
| 5,429,710 | 7/1995 | Akiba et al. . |
| 5,429,995 | 7/1995 | Nishiyama et al. . |
| 5,430,355 | 7/1995 | Paranjpe . |
| 5,433,812 * | 7/1995 | Cuomo et al. ........................ 156/345 |
| 5,434,353 | 7/1995 | Kraus . |
| 5,437,757 | 8/1995 | Rice et al. . |
| 5,464,476 | 11/1995 | Gibb et al. . |
| 5,503,676 | 4/1996 | Shufflebotham et al. . |
| 5,525,159 | 6/1996 | Hama et al. . |
| 5,556,501 | 9/1996 | Collins et al. . |
| 5,573,595 | 11/1996 | Dible . |
| 5,587,038 | 12/1996 | Cecchi et al. . |
| 5,639,357 | 6/1997 | Xu . |
| 5,650,032 | 7/1997 | Keller et al. . |
| 5,669,975 | 9/1997 | Ashtiani . |
| 5,683,537 | 11/1997 | Ishii . |
| 5,690,781 * | 11/1997 | Yoshida et al. ...................... 156/345 |
| 5,707,498 * | 1/1998 | Ngan .............................. 204/192.12 |
| 5,721,021 | 2/1998 | Tobe et al. . |
| 5,763,851 | 6/1998 | Forster et al. . |
| 5,770,098 | 6/1998 | Araki et al. . |
| 5,783,492 | 7/1998 | Higuchi et al. . |
| 5,795,429 | 8/1998 | Ishii et al. . |
| 5,810,931 * | 9/1998 | Stevens et al. ....................... 118/721 |
| 5,851,600 | 12/1998 | Horiike et al. . |
| 5,874,704 | 2/1999 | Gates . |

OTHER PUBLICATIONS

Schneider, Jochen M., et al., "Crystalline alumina deposited at low temperatures by ionized magnetron sputtering," J. Vac. Sci. Technol. A15(3), pp. 1084–1088.

U.S. Ser. No. 08/857,720 (Atty. Dkt. 1800).

U.S. Ser. No. 08/857,921 (Atty. Dkt. 1737).

U.S. Ser. No. 08/857,944 (Atty. Dkt. 1871).

U.S. Ser. No. 08/907,382 (Atty. Dkt. 1957).

U.S. Ser. No. 08/908,341 (Atty. Dkt. 1873).

U.S. Ser. No. 08/908,342 (Atty. Dkt. 1620).

U.S. Ser. No. 08/931,170 (Atty. Dkt. 1812).

U.S. Ser. No. 09/039,695, (Atty. Dkt. 1727).

U.S. Ser. No. 09/049,276 (Atty. Dkt. 938.D2).

U.S. Ser. No. 09/049,839 (Atty. Dkt. 938.D1).

Search report in PCT/US98/10058 issued Nov. 4, 1998.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge,"*J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

U.S. Patent application ser. No. 08/680,335, filed Jul. 10, 1996 (Atty. Dk. 1390–CIP/PVD/DV).

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. Patent application ser. No. 08/461,575, filed Sep. 30, 1992 (Atty. Dk. 364.F1).

U.S. Patent application ser. No. 08/310,617, filed Sep. 30, 1992 (Atty. Dk. 364.P1).

U.S. Patent application ser. No. 08/567,601, filed Jun. 2, 1995 (Atty. Dk. 364.P2).

U.S. Patent application ser. No. 08/559,345, filed Nov. 15, 1995 (Aty. Dk. 938/PVD/DV).

U.S. Patent application ser. No. 08/733,620, filed Oct. 17, 1996 (Attorney Docket # 1457.PVD/DV).

U.S. Patent application ser. No. 08/741,708, filed Oct. 31, 1996 (Attorney Docket #1590/PVD/DV).

U.S. Patent application ser. No. 08/853,024, filed May 8, 1997 (Atty. Dk. 1186.P1/PVD/DV).

U.S. Patent application ser. No. 08/851,946, filed May 6, 1997 (Atty. Dk. 1390.C1/PVD/DV).

U.S. Patent application ser. No. 08/857,719, filed May 16, 1997 (Atty. Dk. 1752/PVD/DV).

PCT Written Opinion issued in Appln PCT/US98/09739.

U.S. 08/971,867 filed Nov. 19, 1997 (Atty Dkt 1957.P1/5585).

* cited by examiner

METHOD AND APPARATUS FOR PRODUCING A UNIFORM DENSITY PLASMA ABOVE A SUBSTRATE

BACKGROUND OF THE INVENTION

The present invention relates to plasma generators, and more particularly, to a method and apparatus for generating a plasma to sputter deposit a layer of material in the fabrication of semiconductor devices.

Low density plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent to the target impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited, at angles which are oblique to the surface of the substrate. As a consequence, materials deposited in etched trenches and holes of semiconductor devices having trenches or holes with a high depth to width aspect ratio, can bridge over, which is undesirable; to prevent this, the sputtered material can be redirected into substantially vertical paths between the target and the substrate by negatively charging the substrate to position vertically oriented electric fields adjacent the substrate if the sputtered material is sufficiently ionized by the plasma. However, material sputtered in a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and/or ion density.

There are several known techniques for exciting a plasma with RF fields including capacitive coupling, inductive coupling and wave heating. In a standard inductively coupled plasma (ICP) generator, RF current passing through a coil generates a plasma in a region surrounded by the coil, the plasma consisting of electromagnetic currents. These currents heat the conducting plasma by ohmic heating, so that it is sustained in steady state. As shown in U.S. Pat. No. 4,362,632, for example, current through a coil is supplied by an RF generator coupled to the coil through an impedance-matching network, such that the coil acts as the first winding of a transformer. The plasma acts as a single turn second winding of the transformer.

A high density plasma typically requires the chamber to be operated at a relatively high pressure. As a result, the frequency of collisions between the plasma ions and the deposition material atoms is increased and the scattering of the deposition atoms is likewise increased. This scattering of the deposition atoms typically causes the deposition layer on the substrate to be thicker on that portion of the substrate aligned with the center of the target and thinner in the outlying regions. Such nonuniformity of deposition is often undesirable in the fabrication of semiconductor devices.

It is recognized that the uniformity with which an etching or deposition operation across the surface of a substrate is adversely affected by variations in the density of the ionized plasma across the surface of the substrate. As a consequence, the uniformity of the plasma density across the substrate surface can be improved, it is believed that the uniformity of the resulting etching or deposition operation can likewise be improved.

A number of designs and arrangements for plasma generating coils have been proposed which are intended to improve the uniformity of the generated plasma. Typically, one or more coils are disposed at locations above the wafer surface and according to many of these proposals, the coils are located outside of the chamber in which the plasma itself is confined. Investigations have indicated that these prior coil arrangements tend to produce plasma fields which have substantial plasma density nonuniformity across the wafer surface.

BRIEF SUMMARY OF THE INVENTION

It is a primary object of the present invention to substantially improve the uniformity of plasma potential or density across the surface of a wafer which is being subjected to various processing operations.

The above and other objects are achieved, according to one embodiment of the present invention, by an apparatus for processing a substrate in the presence of a plasma, in which an RF coil is disposed at an elevation proximate to a plane containing a substrate support. It has been found that such an arrangement can cause the plasma maintained by the coil to have a uniform potential and density parallel to the substrate support. In the illustrated embodiment, the apparatus comprises a chamber enclosing a region maintained at a low pressure; a substrate support disposed in the region and having a substantially horizontal substrate support surface for supporting a substrate; and an RF coil disposed in the chamber for producing a radio frequency field within the chamber to maintain a plasma above the substrate support surface. The coil surrounds a vertical region which contains the substrate support surface and is disposed near the plane of the substrate support surface to cause the plasma to have a more uniform density and potential across substantially the entire surface of the substrate.

DETAILED DESCRIPTION OF THE INVENTION

As will become more readily apparent from the detailed description to be presented below, the present invention results from applicants' discovery that the uniformity of the plasma density above the surface of a semiconductor wafer or other substrate can be substantially improved if the plasma generating coil in accordance with one embodiment of the invention, is located in a region which circumscribes the wafer and if at least the lower most turn of the coil is located close to, or below, the wafer. With this coil arrangement, it has been found that the major part of the flux generated by the coil will be located above the horizontal median plane of the coil and lines of equal plasma density will extend substantially parallel to the wafer surface across the entirety of the wafer surface, and this can be true across substantially the entire vertical extent of the plasma.

Positioning of the plasma generating coil at or below the level of the wafer surface so that the major portion of the plasma located above the coil are features believed to be contrary to the concepts disclosed in relevant published literature and the arrangement provided in commercially available systems of which applicants are aware.

Figure 1:
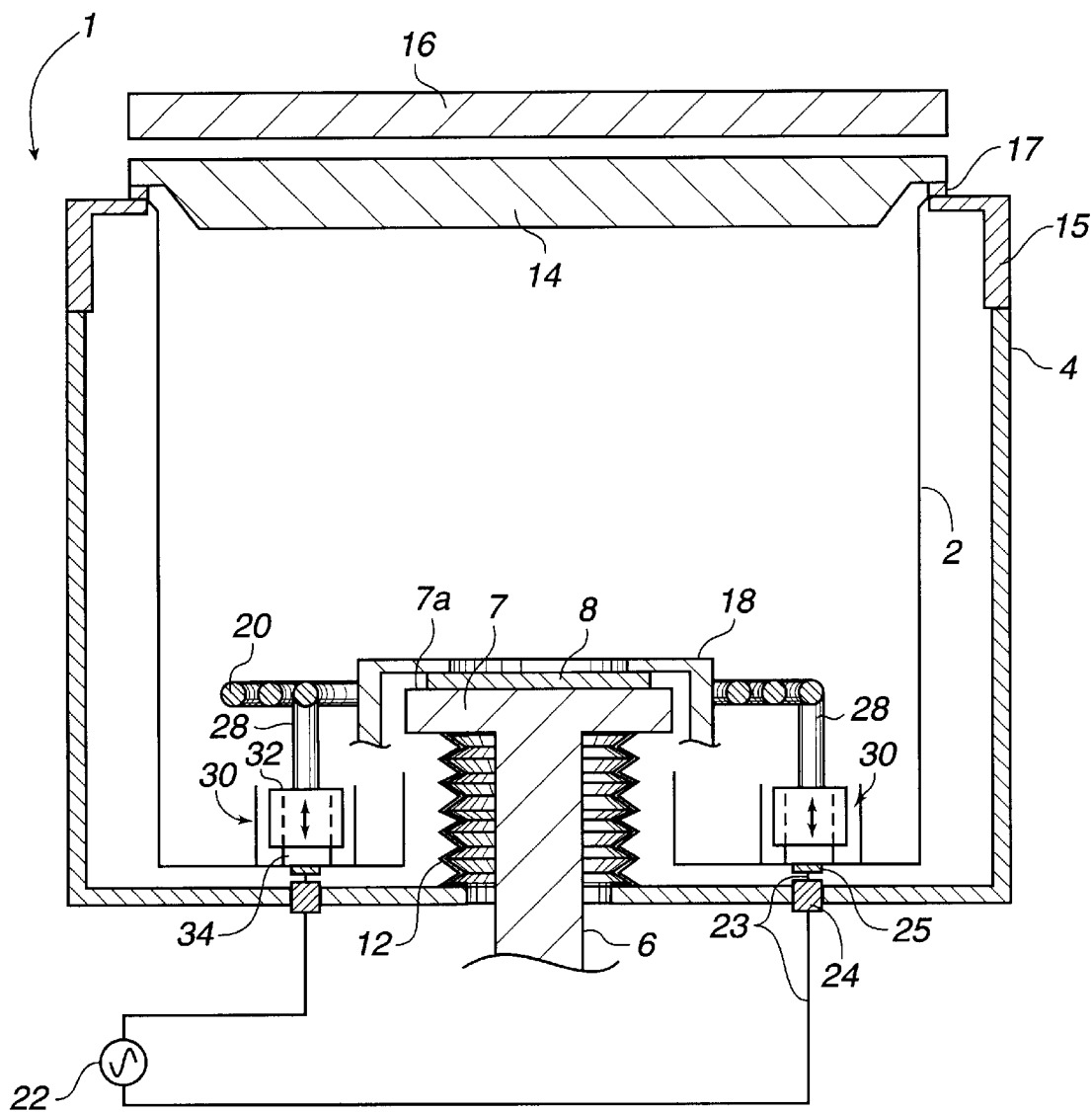
FIG. 1 is an elevational, cross-sectional view showing one embodiment of an apparatus according to the present invention.

A first specific embodiment of apparatus according to the invention is shown in FIG. 1. This apparatus includes a plasma chamber 1 which is partially enclosed by a shield 2 made of a conductive material and disposed in a cylindrical vacuum chamber 4. A pedestal 6 extending through an opening in the bottom of vacuum chamber 4 is provided at its upper end with a substrate support portion 7. The upper surface of the substrate support portion 7 defines a substrate support surface 7a which supports a substrate 8 that is to be processed. The lower end of pedestal 6 is mounted on a support surface (not shown) and may contain an elevator mechanism permitting the substrate support surface to be moved vertically within shield 2. The interior of vacuum chamber 4 is sealed by a bellows 12 connected between the bottom of vacuum chamber 4 and the bottom of the substrate support. Alternatively, the pedestal and associated elevator mechanism may be entirely enclosed within the vacuum chamber 4, obviating the need for the bellows 12.

The embodiments illustrated in the drawings of the present application are intended for deposition of a layer on the upper surface of substrate 8 by sputtering. For this purpose, a target 14 is mounted within the enclosure formed by shield 2, a source adaptor 15 mounted on the top of the vacuum chamber 4 supports the target 14. The target 14 is coupled to a suitable source of biasing voltage. Typically, a negative dc voltage would be applied to target 14 which is insulated from the source adaptor by an insulator ring 17.

Embodiments for deposition of a layer by sputtering have been selected only by way of nonlimiting example. The invention can be applied to any other apparatus in which a plasma is to be created and in which a uniform plasma density across the surface of the substrate is advantageous, including etching apparatus, for example.

Furthermore, while target 14 is illustrated as being substantially disk-shaped, it is to be understood that any suitable target configuration adapted to the particular deposition requirements may be employed.

Also by way of example, the apparatus illustrated herein is one in which erosion of material from target 14 is produced by a rotating magnet assembly, or a magnetron, 16. Here again, any suitable known arrangement can be used to control the generation of impacting ions onto the target 14.

Substrate 8 is held in place on the substrate support surface by a conventional clamp ring 18. A bias may also be applied to the substrate 8 through the clamp ring 18 by suitable bias sources including AC and RF sources.

In this embodiment, a plasma is generated and maintained in the region enclosed by shield 2 by means of a coil 20 which is electrically connected to a source 22 of radio frequency (RF) current. Source 22 is connected to opposite ends of coil 20 via conductors 23 which pass through insulators 24, 25 mounted in openings in the vacuum chamber 4 and the shield 2.

In the embodiment illustrated in FIG. 1, coil 20 is composed of three turns which are wound in a spiral in a horizontal plane about a vertical axis coaxial with the center axis of pedestal 6, the center axis of substrate 8 and, preferably, the center axis of target 14. Coil 20 surrounds the substrate support 6 and, in the illustrated embodiment, is located below the upper surface 7a of the substrate support 6 and below the upper surface of substrate 8.

Coil 20 includes vertical conductors 28 which provide RF current to the coil 20. The conductors 28 are supported by a mechanism which allows coil 20 to be displaced vertically in order to be brought to an elevation which produces an optimal plasma field pattern. In the illustrated embodiment, this mechanism may be composed of two or more hydraulic jacks, or piston-cylinder assemblies 30 which includes a conductive cover member 32 and an insulative base 34. The cover member 32 is preferably spaced from the shield 2 and the base 34 so as to form labyrinthine passageways to prevent the formation of conductive paths of deposition material which could short the coil 20 to the shield 2.

The coil conductors 28 are coupled to the conductors 23 via the conductive member 32 and a conductive core (not shown) inside the insulative base 34.

Preferably, coil 20 is movable over a range extending between a lower limit which is somewhat below the upper surface of substrate 8 to an upper limit which is somewhat above the upper surface of substrate 8.

It is believed that when coil 20 is at the elevation described above in which the plane of the coil is below the plane of the substrate, the plasma that the coil produces will be characterized by lines of equal electron density (electrons/cc) which extend, with a high degree of uniformity, parallel to the upper surface of substrate 8, and this uniformity will exist throughout virtually the entire vertical dimension of the plasma field. Even the lines of equal electron density at the center of the plasma field will extend parallel to the upper surface of the substrate across a region coextensive with substantially the entire substrate surface. In contrast, in the case of many prior coil arrangements, these lines of equal electron density at the center of the plasma field are believed to be coextensive with only a portion of the associated substrate surface.

Furthermore, in contrast to the conditions believed to exist with prior art coil arrangements, in the embodiment shown in FIG. 1, virtually the entire plasma field will be situated above coil 20.

Because the plasma generated by coil 20 in accordance with one aspect of the present invention contains lines of equal electron density which extend parallel to the substrate surface over substantially the entirety of the substrate surface, it is believed that any uniformity of the deposition material in transit from the target 14 to the workpiece 8 will tend not to be disrupted by the plasma. Consequently, deposition material from a uniform source can be ionized and deposited with a reduced amount of nonuniformity caused by the ionizing plasma.

Furthermore, because of the location of the coil in accordance with the present invention, establishing an optimum vertical spacing between substrate 8 and target 14 is facilitated.

In the embodiment illustrated in FIG. 1, the vertical position of coil 20 is such that clamp ring 18 also acts as a heat shield to protect substrate 8 against nonuniform heating by heat radiated from coil 20. In contrast, in the case of prior art coils which are disposed well above the upper surface of the substrate being processed, uneven heating by radiation from the coil is often a problem.

While FIG. 1 illustrates a coil having three turns, it will be appreciated that, depending on the requirements of the particular apparatus, a different number of coil turns can be employed. In some applications, a single turn coil may be used.

Adjustment of the height of coil 20, by operation of jacks 30, is advantageous because, for processes such as reactive metal ion deposition, using for example a Ti target, different plasma gasses, such as Ar or $N_2$, there may be variations in the plasma density distribution due to differences in rate of recombination, etc. It is for this reason that it is desirable to be able to adjust the height of coil 20 in order to optimize the configuration of the plasma field.

Figure 2:
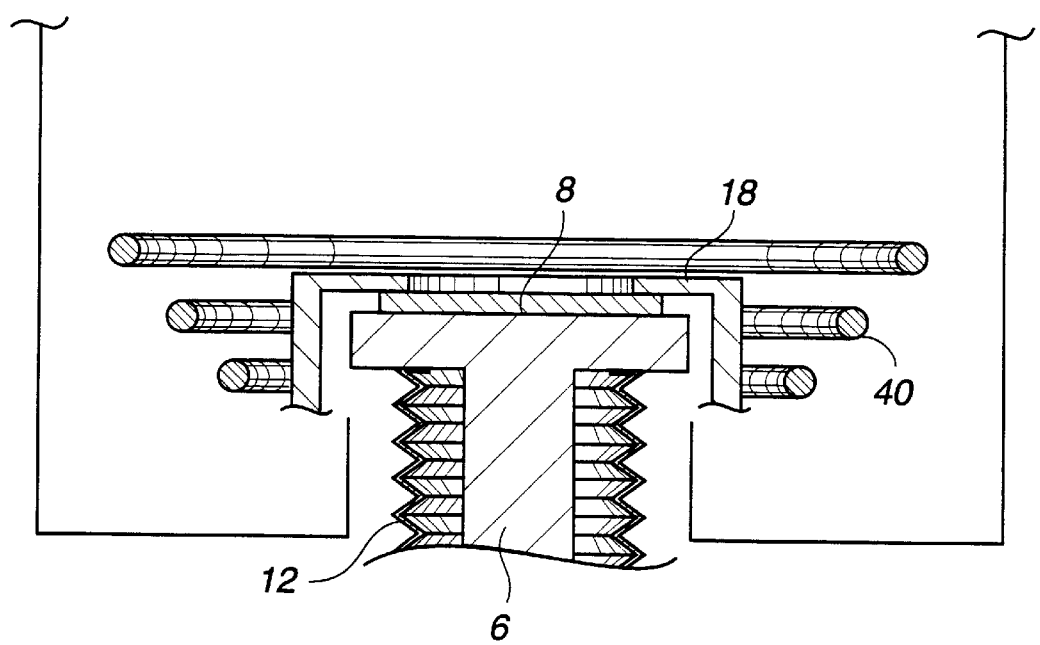
FIG. 2 is a view similar to that of FIG. 1 showing a second embodiment of apparatus according to the invention.

FIG. 2. Illustrates a second embodiment of the invention, in which identical components are illustrated with the same reference numerals, and these components are not again described. For the sake of simplicity, FIG. 2 does not illustrate certain components such as, for example, vacuum chamber 4, target 14, current source 22, insulators 24, jacks 30. Some or all of these components may be present in the embodiment of FIG. 2 in the same arrangement as shown in FIG. 1. However, it is contemplated that certain components may be eliminated in some applications. For example, the elevation of the coil may be fixed at an optional height for a particular process. As such, the jacks 30 may be eliminated in those applications.

The embodiment shown in FIG. 2 differs from that shown in FIG. 1 in that coil 20 of FIG. 1 is replaced by a coil 40 which is wound in a helical form so that the coil follows a frustoconical path with each turn having a larger diameter than the turn immediately therebelow. This arrangement may be preferred when shield 2 has a relatively small diameter. It may be desirable, in this case, to modify clamp ring 18 in a manner illustrated in FIG. 3, to be described below, to assure adequate heat shielding of substrate 8 from thermal radiation produced by coil 40.

Figure 3:
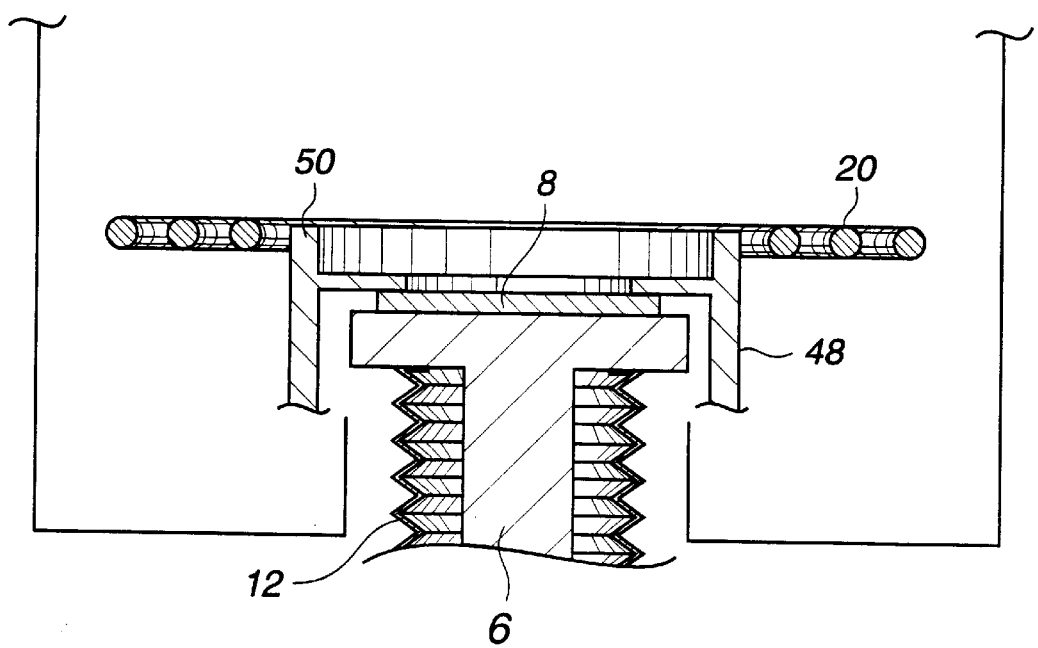
FIG. 3 is a view similar to that of FIG. 1 showing a third embodiment of apparatus according to the invention.

FIG. 3 illustrates a modified version of the embodiment of FIG. 1 in which coil 20 is placed slightly above the plane of the upper surface of substrate 8. As mentioned earlier herein, such a positioning of coil 8 may be found to produce an optimum plasma field configuration, depending on the nature of the material to be deposited on the substrate surface and the composition of the ionized gas within shield 2. When coil 20 is to be disposed at the position illustrated in FIG. 3, use is preferably made of a modified clamp ring 48 having an upwardly projecting portion 50 which constitutes a heat shield between coil 20 and substrate 8.

Figure 4:
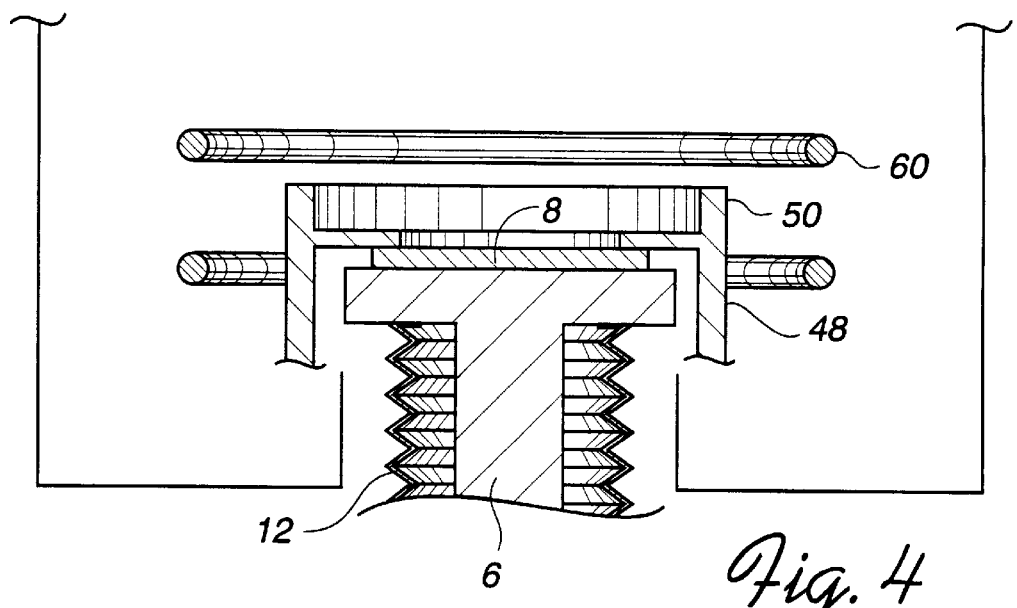
FIG. 4 is a view similar to that of FIG. 1 showing a fourth embodiment of apparatus according to the invention.

FIG. 4 illustrates another modified version of the embodiment of FIG. 1 in which coil 20 is replaced by a cylindrical coil 60 having two turns with substantially equal diameters. The turns are thus located one above the other, with the lower turn being disposed at approximately the level of substrate 8 and the upper turn being located a small distance above the level of substrate 8. In order to optimize the distribution of the density of the plasma produced by coil 60, the lower turn may be slightly below or slightly above the level of substrate 8. Because the upper turn of coil 60 is located somewhat above substrate 8, this embodiment includes the same modified clamping ring 48 as that employed in the embodiment of FIG. 3.

Figure 5:
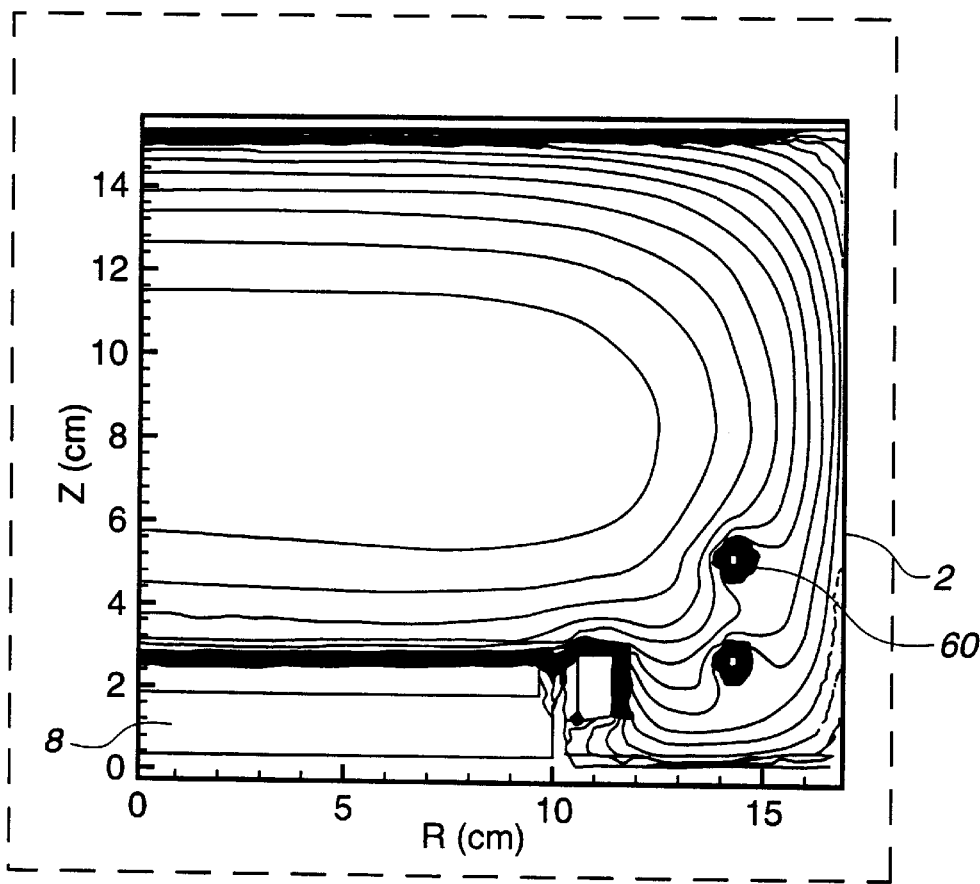
FIG. 5 is an elevational, cross-sectional view of an apparatus corresponding essentially to the fourth embodiment of the invention, including a computer simulation of the pattern of equipotential lines believed to be achieved in the fourth embodiment.

FIG. 5 illustrates apparatus essentially according to the fourth embodiment and further illustrates a computer simulation of the equipotential lines of the plasma which is believed to be created within the interior space enclosed by shield 2 when a coil 60 according to the fourth embodiment is utilized to produce the plasma. It is believed that the pattern of equipotential lines in a plasma field corresponds generally to the pattern of equal plasma density lines within the field. It should be readily apparent from FIG. 5 that equipotential lines extend essentially parallel to the upper surface of substrate 8 over substantially the entire width, or diameter of the substrate.

Superimposed on the portion of shield 2 shown in FIG. 5 is a coordinate system representing distances from an origin whose abscissa value is the central axis of substrate 8 and whose ordinate value is an arbitrarily selected point below the upper surface of substrate 8. The abscissa scale of this coordinate system is designated R and the ordinate thereof is designated Z. It will be seen that the upper surface of substrate 8 has an ordinate value of $Z \approx 3$ cm. Exemplary values for the plasma potential voltage calculated at selected points in the RF field illustrated in FIG. 5 are shown in the following table.

| COORDINATE VALUES OF POINT | | PLASMA POTENTIAL |
|---|---|---|
| Z (cm) | R (cm) | VOLTAGE |
| 5 | 0.5 | 6.87 |
| 5 | 5 | 6.98 |
| 5 | 10 | 6.92 |
| 7 | 0.5 | 7.46 |
| 7 | 5 | 7.53 |
| 7 | 10 | 7.48 |
| 9 | 0.5 | 7.57 |
| 9 | 5 | 7.60 |
| 9 | 10 | 7.49 |

The precise locations of the turns of coil 60 can be determined from the coordinate scales of FIG. 5. While FIG. 5 shows one-half of shield 2 and substrate 8, it will be understood that the other half of the plasma is mirror-symmetrical to the half which is illustrated, i.e., the equipotential lines and equal flux density lines of the plasma are symmetrical about the vertical, or Z, axis of the coordinate system, which axis passes through the origin of the coordinate system.

In view of the high degree of uniformity which can be imparted to a plasma field in accordance with the present invention, the possibility of successfully processing large diameter substrates, up to 300 mm in diameter, particularly for deposition of metal coatings, is presented.

It should be noted that embodiments of the present invention can also include single turn coils and coils whose turns are spaced vertically from one another, i.e. constitute a cylindrical coil.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for depositing deposition material onto a substrate in the presence of a plasma, said apparatus for use in connection with a source of radio frequency current, comprising:

a chamber defining a chamber axis;

a source of deposition material;

a substrate support disposed in said chamber and having a substrate support surface adapted to support a substrate that has an exposed surface, said substrate support surface being axially displaced from said source of deposition material and positioned to receive said deposition material from said source onto said substrate support surface; and a coil disposed in said chamber, axially displaced from said source of deposition material and responsive to radio frequency current conducted through said coil for producing a radio frequency field within said chamber to maintain a plasma adjacent said substrate support surface, said coil surrounding a region which contains said substrate support surface and being positioned so that said plasma has equipotential lines which extend substantially parallel to said substrate support surface across substantially the entire exposed surface of said substrate and so that said substrate support surface is axially positioned between said deposition material source and at least a portion of said coil.

2. The apparatus of claim 1 wherein said coil is positioned at an axial displacement proximate to a plane containing said substrate support surface so that said plasma has a uniform density parallel to said exposed surface of said substrate.

3. The apparatus of claim 2 wherein said coil is a flat coil having a plurality of turns disposed in a common plane.

4. The apparatus of claim 2 wherein said coil is a helical coil having a plurality of turns which are axially spaced from one another, with each turn having a diameter larger than the diameter of an adjacent turn.

5. The apparatus of claim 2 further comprising a heat shield interposed between said coil and said substrate support surface.

6. The apparatus of claim 1 wherein said coil is located so that at least a portion of said coil is coplanar with a plane containing said substrate support surface.

7. The apparatus of claim 6 wherein said heat shield is constituted by a clamping ring disposed for clamping said substrate in place on said substrate support surface.

8. The apparatus of claim 1 wherein said substrate support surface is axially positioned between said deposition material source and all of said coil.

9. The apparatus of claim 1 further comprising an elevator supporting said coil for axial displacement in said chamber.

10. The apparatus of claim 9 wherein said elevator comprises a mechanism for placing said coil in a selected vertical axial position relative to said substrate support surface.

11. The apparatus of claim 1 wherein said chamber is cylindrically shaped and said chamber axis is a central axis aligned with the center of said chamber.

12. The apparatus of claim 1 wherein said chamber axis is a vertical axis aligned with the center of said chamber.

13. The apparatus of claim 1 wherein said equipotential lines extend parallel to said substrate support surface across the entire exposed surface of said substrate.

14. An apparatus for processing a substrate in the presence of a plasma, said apparatus for use in connection with a source of radio frequency current, comprising:

a chamber adapted to enclose a plasma;

a substrate support disposed in said chamber and having a substantially horizontal substrate support surface adapted to support a substrate that has an upper surface; and a coil disposed in said chamber and responsive to radio frequency current conducted through said coil for producing a radio frequency field within said chamber to maintain a plasma above said substrate support surface, said coil surrounding a vertical region which contains said substrate support surface and being positioned so that said plasma has equipotential lines which extend substantially parallel to said support surface across substantially the entire upper surface of said substrate wherein said coil is positioned at an elevation proximate to a plane containing said substrate support surface so that said plasma has a uniform density parallel to said upper surface of said substrate; and wherein at least a portion of said coil is disposed in horizontal alignment with said substrate support surface.

15. The apparatus of claim 14 wherein said substrate support surface is horizontal and said equipotential lines extend parallel to said substrate support surface across the entire exposed surface of said substrate.

16. An apparatus for processing a substrate in the presence of a plasma, said apparatus for use in connection with a source of radio frequency current, comprising:

a chamber adapted to enclose a plasma;

a substrate support disposed in said chamber and having a substantially horizontal substrate support surface adapted to support a substrate that has an upper surface; and a coil disposed in said chamber and responsive to radio frequency current conducted through said coil for producing a radio frequency field within said chamber to maintain a plasma above said substrate support surface, wherein at least a portion of said coil is disposed in horizontal alignment with said substrate support surface.

17. The apparatus of claim 16 wherein said plasma has a uniform density parallel to said substrate support surface.

18. The apparatus of claim 16 wherein said coil is located so that at least a portion of said coil is below said substrate support surface.

19. The apparatus of claim 16 wherein said coil is a flat coil having a plurality of turns disposed in a common horizontal plane.

20. The apparatus of claim 16 wherein said coil is a helical coil having a plurality of turns which are vertically spaced from one another, with each turn having a diameter larger than the diameter of the immediately underlying turn.

21. The apparatus of claim 16 wherein said substrate support surface is horizontal.

22. An apparatus for processing a substrate in the presence of a plasma, said apparatus for use in connection with a source of radio frequency current, comprising:

a chamber having a plasma generation region;

a substrate support disposed in said chamber and having a substantially horizontal substrate support surface adapted to support a substrate that has an upper surface;

a coil disposed in said chamber and adjacent to said plasma generation region and responsive to radio frequency current conducted through said coil for producing a radio frequency field within said plasma generation region to maintain a plasma above said substrate support surface; and a heat shield having a vertical wall interposed between said coil and said substrate support surface.

23. The apparatus of claim 22 wherein said heat shield is constituted by a clamping ring disposed for clamping said substrate in place on said substrate support surface.

24. The apparatus of claim 22 wherein said substrate support surface is horizontal.

25. An apparatus for processing a substrate in the presence of a plasma, said apparatus for use in connection with a source of radio frequency current, comprising:
  a chamber adapted to enclose a plasma and defining a chamber axis;
  a source of deposition material;
  a substrate support disposed in said region and having a substrate support surface adapted to support a substrate that has an exposed surface, said substrate support surface being axially displaced from said source of deposition material and positioned to receive said deposition material from said source onto said exposed surface of said substrate;
  a coil disposed in said chamber and responsive to radio frequency current conducted through said coil for producing a radio frequency field within said chamber to maintain a plasma adjacent said substrate support surface; and
  an elevator supporting said coil for axial displacement in said chamber relative to said substrate support surface.

26. The apparatus of claim 25 wherein said elevator comprises a mechanism for placing said coil so that said substrate support surface is axially positioned between said source of deposition material and at least a portion of said coil.

27. An apparatus for processing a substrate in the presence of a plasma, said apparatus for use in connection with a source of radio frequency current, comprising:
  a chamber adapted to enclose a plasma and defining a chamber axis;
  a source of deposition material;
  a substrate support disposed in said chamber and having a substrate support surface adapted to support a substrate that has an exposed surface, said substrate support surface being axially displaced from said source of deposition material and positioned to receive said deposition material from said source onto said exposed surface of said substrate; and
  coil means disposed in said chamber, axially displaced from said source of deposition material and responsive to radio frequency current conducted through said coil means for producing a radio frequency field within said chamber to maintain a plasma above said substrate support surface, said plasma having equipotential lines which extend substantially parallel to said substrate support surface across substantially the entire upper surface of said substrate and so that said substrate support surface is axially positioned between said source of deposition material and at least a portion of said coil means.

28. The apparatus of claim 27 wherein said equipotential lines extend parallel to said substrate support surface across the entire exposed surface of said substrate.

29. A method for generating a plasma in a chamber defining a chamber axis, and having a source of deposition material and a substrate support provided with a substrate support surface, said substrate support surface being axially displaced from said source of deposition material, comprising:
  placing a substrate having an exposed surface on said substrate support surface wherein said substrate exposed surface is positioned to receive said deposition material from said source; and
  conducting radio frequency current through a plasma generating coil positioned around said substrate support surface wherein said substrate support surface is axially positioned between said source of deposition material and at least a portion of said coil to maintain a plasma having equipotential lines which extend substantially parallel to said substrate support surface.

30. The method of claim 29 wherein at least a portion of said coil is positioned coplanar with a plane containing said substrate support surface.

31. The method of claim 29 wherein at least a portion of said coil is at an axial displacement proximate to that of said substrate support surface.

32. The method of claim 31 wherein said substrate support surface is axially positioned between said deposition material source and all of said coil.

33. The method of claim 29 wherein said plasma has a density and said coil is disposed at an axial displacement which maximizes the uniformity of the plasma density parallel to said substrate support surface.

34. The method of claim 29 further comprising shielding said substrate using a heat shield positioned between said coil and said substrate.

35. The method of claim 29 further comprising changing the position of said coil relative to said substrate support surface using an elevator coupled to said coil.

36. The method of claim 29 wherein said chamber is cylindrically shaped and said chamber axis is a central axis aligned with the center of said chamber.

37. The apparatus of claim 29 wherein said chamber axis is a vertical axis aligned with the center of said chamber.

38. The method of claim 29 wherein said equipotential lines extend parallel to said substrate support surface.

39. A method for generating a plasma in a chamber having a substrate support provided with a substrate support surface, composing:
  placing a substrate having an upper surface on said substrate support surface; and
  conducting radio frequency current through a plasma generating coil positioned around said substrate support surface to maintain a plasma having equipotential lines which extend substantially parallel to said substrate support surface wherein at least a portion of said coil is positioned at an elevation below a plane containing said substrate support surface; and wherein at least a portion of said coil is disposed in horizontal alignment with said substrate support surface.

40. The method of claim 39 further comprising shielding said substrate using a heat shield positioned between said coil and said substrate.

41. The method of claim 39 wherein said equipotential lines extend parallel to said substrate support surface.

42. A method for generating a plasma in a chamber having a substrate support provided with a substrate support surface, comprising:
  changing the position of a coil disposed in said region of said chamber relative to said substrate support surface, using an elevator coupled to said coil;
  placing a substrate having an upper surface on said substrate support surface; and
  conducting radio frequency current through said coil to maintain a plasma in said chamber.

43. A method for generating a plasma in a chamber having a substrate support provided with a substrate support surface, comprising:
  placing a substrate having an upper surface on said substrate support surface;

conducting radio frequency current through said coil to maintain a plasma in said chamber; and clamping said substrate to said substrate support surface using a clamp and shielding said substrate from said coil using a vertical wall of said clamp positioned between said coil and said substrate.

* * * * *